United States Patent [19]
Satoh

[11] Patent Number: 5,117,477
[45] Date of Patent: May 26, 1992

[54] OPTICAL FUNCTIONING ELEMENT USING A TRANSPARENT SUBSTRATE WITH MATCHING LATTICE CONSTANT

[75] Inventor: Shiro Satoh, Ogawara, Japan

[73] Assignees: Ricoh Company, Ltd., Tokyo; Ricoh Research Institute of General Electronics Co., Ltd., Natori, both of Japan

[21] Appl. No.: 645,694

[22] Filed: Jan. 25, 1991

[30] Foreign Application Priority Data

Feb. 14, 1990 [JP] Japan ................................ 2-33091

[51] Int. Cl.⁵ .................... G02B 6/00; H01L 31/12; H01L 33/00
[52] U.S. Cl. ............................ 385/88; 357/19; 357/30; 385/141
[58] Field of Search ............... 350/96.10–96.12, 350/96.34; 357/17, 19, 30 G

[56] References Cited

U.S. PATENT DOCUMENTS

| | | | |
|---|---|---|---|
| 3,962,714 | 6/1976 | King | 372/50 X |
| 4,212,020 | 7/1980 | Yariv et al. | 372/50 X |
| 4,318,059 | 3/1982 | Lang et al. | 372/50 X |
| 4,607,370 | 8/1986 | Mukai et al. | 372/50 |
| 4,791,636 | 12/1988 | Yamamoto et al. | 372/44 X |
| 4,990,970 | 2/1991 | Fuller | 357/19 X |
| 4,996,163 | 2/1991 | Sasaki | 357/30 G X |
| 5,014,096 | 5/1991 | Matsuda et al. | 357/30 G X |

FOREIGN PATENT DOCUMENTS

61-166190  7/1986  Japan ................................ 372/50 X

OTHER PUBLICATIONS

IOOC 89 Lecture No. 18B2-6, "Low Threshold Electrically-Pumped Vertical-Cavity Surface-Emitting Micro-Lasers", J. L. Lowell et al.
K. Kasahara et al., Double Heterostructure Optoelectronic Switch as a Dynamic Memory with Low-Power Consumption, Applied Physics Letters, vol. 52, Feb. 29, 1988, No. 9, American Institute of Physics, pp. 679–681.
David A. B. Miller et al., The Quantum Well Self-Electrooptic Effect Device: Optoelectronic Bistability and Oscillation, and Self-Linearized Modulation, vol. QE-21, No. 9, pp. 1462–1476, IEEE Journal of Quantum Electronics, Sep. 1985.
Akio Sasaki et al., Integrated Optical Devices of InGaAsP/InP Heterojunction Phototransistor and Inner Stripe Light-Emitting Diode, Dec. 1985, vol. LT-3, No. 6, Journal of Lightwave Technology.

Primary Examiner—Akm E. Ullah
Attorney, Agent, or Firm—Oblon, Spivak, McClelland, Maier & Neustadt

[57] ABSTRACT

An optical functioning element comprising: an optical functional element having a layer-stacked structure including a crystalline substance layer; a substrate for mounting the optical functional element; and an epitaxial growth layer of the crystalline substance formed between the optical functional element and the substrate. The substrate becomes transparent with respect to the light accessible to the optical functional element so that it becomes possible to optically access the functional element from both sides of the substrate without partly removing the substrate for passing through the light.

16 Claims, 5 Drawing Sheets

OPTICAL FUNCTIONING ELEMENT USING A TRANSPARENT SUBSTRATE WITH MATCHING LATTICE CONSTANT

BACKGROUND OF THE INVENTION

1. Field of the Invention

The present invention relates to an optical functioning element which is applicable to optical devices such as a two-dimensional optical image processor, an optical calculation system, a photosensitive IC, etc. and comprises an optical element or combination of a plurality of optical elements, each element being formed on a substrate which is transparent with respect to the wavelength of light emitted from gallium arsenide (GaAs) or aluminum gallium arsenide (AlGaAs) and to the wavelength to which GaAs or AlGaAs is photosensitive.

2. Description of the Related Art

There have been proposed and developed various types of optical functioning elements which function as logical elements and can be made two-dimensionallized such as an optical bistable circuit, a differential gain circuit, or optical switch.

Most of the optical functioning elements have a structure which enables the element not only to receive an optical input from outside but emit an optical output to outside as well. A first type optical functioning element is one which comprises a substrate and which outputs the optical signal from the front surface of the substrate and receives the input signal from outside through the same front surface of the substrate. Another type of optical functioning element is one which comprises a substrate and which outputs the optical signal from the front surface of the substrate and receives the input signal from the rear surface of the substrate or vice versa.

The optical functioning element of the type which receives an input signal from one surface thereof and outputs the signal from the opposite surface thereof is disclosed in IEEE Quantumn Elect. Vol QE-21(9)(1985)1462.

The disclosed element comprises an n-type GaAs substrate on which are stacked in this order an n-type AlGaAs layer, an n-type superlattice layer comprising alternately stacked n-type GaAs films of several ten Ås thick and n-type AlGaAs films of the same thickness, a multiquantum well (MQW) layer comprising alternately stacked GaAs films of a little less than 100Å thick and AlGaAs films of the same thickness, s superlattice layer comprising alternately stacked p-type GaAs films of several ten Ås thick and p-type AlGaAs films of the same thickness, and a p-type AlGaAs layer. The n-type GaAs substrate is etched to form a hole of about 100Å diameter therein to reach the n-type AlGaAs layer to constitute a mesa structure at the position behind and corresponding to the stacked-layer structure mentioned above. Due to this hole, the light of the above mentioned wavelength penetrates and passes through the stacked-layer structure without being blocked by the substrate.

That is, in accordance with the optical functioning element mentioned above, an optical logic function is obtained by vertically passing the light through the element from the front surface to the rear surface or vice versa. For this purpose, the window (hole) is formed through the substrate so as to prevent the light from being absorbed by the substrate of n-type GaAs.

Next, a second type of optical functioning element which receives the input optical signal from the front surface thereof and outputs the signal from the same front surface is disclosed in Appl. Phys. Lett. Vol 52(1988)679.

The disclosed element comprises an SI (Semi-Insulation)-GaAs substrate on which are stacked in this order an n-type GaAs layer, an n-type AlGaAs layer, an n-type GaAs layer, a p-type GaAs layer, a p-type AlGaAs layer, and a p-type GaAs layer. The input light is transmitted to the element from the uppermost layer of the stacked structure and the output light is emitted from the same uppermost layer so as to achieve a memory function or other logic functions.

A third type of optical functioning element which receives the input light from the rear surface thereof and emits the output light from the front surface thereof is disclosed in J. Lightwave Tech. Vol LT-3(6)(1985)1264.

The disclosed element comprises an n-type InP substrate, a light receiving portion formed on the substrate and a light emitting portion formed on the light receiving portion. The light receiving portion is composed of an n-type InP emitter, a p-type InGaAsP gate, an n-type InGaAsP buffer, an n-type InP buffer, and an n-type InGaAsP absorber, stacked on the substrate in this order. The light emitting portion is composed of an n-type InP confining layer, an n-type InGaAsP active layer and a p-type InP confining layer, stacked on the light receiving portion in this order so as to achieve an optical logic function.

In accordance with the above mentioned third structure, the forbidden band width of the n-type InP is wider than that of the InGaAsP layer which generates or absorbs light and the InGaAsP layer's lattice matches with the InP layer's lattice. Therefore, it becomes possible for the light to access the element from either side of the element having the substrate being attached thereto. However, with regard to the GaAs group or the AlGaAs group, the substrate of GaAs has the narrowest forbidden band width of all the materials in the group. Therefore, it is impossible to realize the structure of the third type mentioned above with the use of the GaAs or AlGaAs group materials.

Also, in IOOC '89, Lecture No. 18B2-6 is proposed a fourth type of optical functioning element comprising a GaAs substrate and an InGaAs layer formed on the substrate. The InGaAS layer has a lattice constant which is far different from that of the GaAs substrate and a forbidden band width which is narrower than that of the GaAs substrate. By stacking the InGaAs layer on the GaAs substrate, the substrate becomes transparent with respect to the accessing light having a predetermined wavelength.

In the event that the light emitting portion (layer) or light receiving portion (layer) of the element to which the light accesses is made from GaAs or AlGaAs, the substrate on which the layer is stacked is made from GaAs from the standpoint of lattice matching.

In accordance with the first example of the optical functioning element of the related art mentioned above, a part of the GaAs substrate is removed so that the light is not absorbed by the substrate at this part. The removing process is conducted in such a way that this part of the substrate is etched with the use of an etching solution having different etching rates (effects) with respect to GaAs and AlGaAs, for example an ammonium solution, so that the etching process is stopped at the surface of the AlGaAs layer whereby only the GaAs layer is selectively etched and removed.

It is to be noted that the GaAs substrate has to be at least 70 to 100 μm thick to maintain the strength thereof and to prevent it from being distorted.

Also, the substrate is etched not only in the vertical direction (perpendicular to the substrate surface) but also in the lateral direction thereof with the same etching rate so that a hole is formed in the substrate which hole has a diameter twice as large as the depth thereof. Such a hole hampers the close arrangement of a plurality of elements in a two-dimensional plane to constitute an array device. Therefore, when the array device is to be made, one common hole is formed for a plurality of elements instead of forming a hole for each of respective elements, which reduces the strength of the device and makes it difficult to widely arrange a large number of elements since the device becomes curved and distorted. Especially, when the element has a light emitting function, heat is generated from the element, which impairs the functional reliability of the element since the element itself does not effectively radiate heat. Therefore, a plurality of elements have to be directly mounted on a heat radiator plate made from transparent materials, for example, sapphire, which involves problems such that electrode patterns have to be precisely formed on the radiator plate, that the periphery of the element has to be covered, and that the element has to be accurately positioned with respect to the radiator plate. Therefore, it becomes very difficult to realize a high density two-dimensional array device using the optical functioning elements of the related art mentioned above.

Besides, there are further problems at the time of producing the element such that it becomes necessary to form patterns on both of the upper and lower surfaces of the substrate, and that the n-type AlGaAs layer surface which is exposed by the partial etching of the GaAs substrate mentioned above is roughened by the etching process, which induces the loss of optical power of input and output signals.

The second example of the optical functioning element mentioned above has the structure in which the accessing light is received and emitted from the same surface of the element substrate, which obviates the problems of the first example mentioned above.

However, in accordance with the structure of the second example, it becomes necessary to prepare an optical system or device for separating the input and output light beams since the optical systems or devices for receiving input beams from and for transmitting output beams to are disposed in the same side of the element. This hampers the realization of a small and compact optical system using the elements to constitute a two-dimensional device. Besides, another problem arises that it becomes necessary to accurately align the element with the other optical systems.

Next, with regard to the third example of the optical functioning element of the related art mentioned above, the structure of this example can not be applied to the structure in which the GaAs or AlGaAs group materials are used. This is because light can not penetrate through the substrate since the forbidden band width of the substrate made from GaAs is the narrowest.

Also, in accordance with the fourth example of the optical functioning element of the related art mentioned above, the light emitting layer is made from InGaAs which has a narrower forbidden band width than GaAs. Therefore, the InGaAs layer has to be stacked on the GaAs substrate. However, the lattice structure of the InGaAs layer does not match with that of the GaAs substrate, which causes distortion of the element. Therefore, it becomes difficult to heighten the quality of the stacked-layer structure of the element and easy to generate the dislocation defects. Also, due to the heat generated from the element, the line defects of the structure are generated and transferred within the structure, which degrades the quality of the element and impairs the stable function of the element.

SUMMARY OF THE INVENTION

The present invention was made considering the above mentioned problems of the related art.

It is therefore an object of the present invention to provide an optical functioning element featured in that it becomes possible to access the element from both sides of the substrate thereof when constituting the element by GaAs and AlGaAs, that the substrate thereof is strong enough to form a two-dimensional array device, that the element is transparent with respect to the accessing light without forming a hole in the substrate, and that the substrate lattice structure matches with GaAs and AlGaAs.

Further, the present invention aims at providing an optical functioning element which functions as light emitting element, a light receiving element, an optical resonator, or a monolithic compound device comprising the above mentioned elements and emits the optical output from the rear surface of the substrate or receives the optical input from the rear surface of the substrate.

The above mentioned object of the present invention can be achieved by an optical functioning element comprising:

an optical functional element having a layer-stacked structure including a crystalline substance layer;

a substrate for mounting the optical functional element; and an epitaxial growth layer of the crystalline substance formed between the optical functional element and the substrate.

More particularly, the object of the invention can be achieved by an optical functioning element having a structure constructed as follows. The element has a forbidden band width corresponding to a value of energy larger than the output light energy from the light emitting layer made from GaAs or AlGaAs. The forbidden band width also corresponds to a value of energy larger than the energy of input light to which the light receiving layer made from GaAs or AlGaAs is sensitive. The element comprises a substrate which is made from a substance having a lattice constant close to that of GaAs or AlGaAs so that it becomes possible to epitaxially grow GaAs or AlGaAs on the substrate made from the substance. On the substrate is formed a light emitting element, a light receiving element, a waveguide element, a resonator element, or a monolithic device comprising a plurality of above mentioned elements. Each element is formed by a layer-stacked structure comprising GaAs or AlGaAs layers formed by the epitaxial growth process on the substrate. Light penetrates through the substrate without making a through hole therein so that it becomes possible to output the optical signal from the rear surface of the substrate or receive the optical input from the rear surface of the substrate.

Further, in accordance with the present invention, the substrate is made from a single crystal substance having a lattice constant which differs from that of GaAs or AlGa As by less than 4%, such as calcium fluoride, strontium fluoride, or a mixed crystal of those two.

Also, the substrate may be made from a compound such as ZnSe or ZnSSe having a lattice constant which differs from that of GaAs or AlGaAs by less than 0.4%, which makes it possible to further heighten the quality of optical functioning element made from GaAs or AlGaAs by more certainly reducing the distortion of the element.

In accordance with the above mentioned structure of the optical functioning element of the present invention, the single crystal substrate is made from a substance having a lattice constant which is close enough to that of GaAs or AlGaAs to match with the lattice of those materials. Therefore, it becomes possible to obtain a high quality layered structure made from GaAs and AlGaAs without applying a special arrangement for avoiding distortion such as arranging a super lattice structure. Instead, it becomes possible to obtain the high quality layered structure with the use of an ordinary method for forming film of GaAs or AlGaAs, such as MOCVD (Metal Organic Chemical Vapor Deposition), MBE (Molecular Beam Epitaxy) or LPE (Liquid Phase Epitaxy).

Also, the substrate has a forbidden band width corresponding to an energy larger than the optical energy of light input to or output from the GaAs or AlGaAs layer. Therefore, it becomes possible without partly removing the substrate to access the element from both sides of the substrate. That is, it becomes possible to emit the optical output from the front surface of the substrate and receive the optical input from the rear surface of the substrate, or vice versa. Also, it becomes possible to receive the optical input from both sides of the substrate and emit the optical output both from the same side surface.

Accordingly, in accordance with the present invention, it becomes possible to realize a system which achieves a three-dimensional optical access to the element including the vertical direction with respect to the substrate.

Also, the distortion of the element is minimized due to the arrangement of the substance used as the substrate having a small difference of lattice constant from that of GaAs or AlGaAs. Therefore, the inducement of defects while functioning is reduced, the service life of the element is elongated and the reliability of the element is raised.

Further, in accordance with the present invention, the element can be optically accessed from both of the front and rear surfaces thereof and able to emit optical output from the same side surface, without making a hole in the substrate. Therefore, the substrate is strengthened and the heat radiation effect is raised, which makes it possible to realize a high density two-dimensional array device using a plurality of the elements which is bistable and functions as a device such as an optical switch, an optical memory, or a differential gain circuit.

As the above mentioned lattice constant difference becomes small, the problems due to the substrate distortion, in particular, degradation of crystalline characteristic, generation of crystalline defects, shortening of service life, lowering of functional reliability, etc. are more certainly improved. It is desirable to use as the substrate a substance having a lattice constant difference of less than 4% such as calcium fluoride, strontium fluoride or a mixed crystal of those two.

It is further desirable to use as the substrate a substance having a lattice constant difference of less than 0.4% such as ZnSe, a mixed crystal of ZnSSe having an appropriate composition ratio, or a mixed crystal of calcium fluoride and strontium fluoride so as to further upgrade the crystalline characteristic of the epitaxial layer of GaAs or AlGaAs and raise the functional reliability as well as to elongate the service life of the element.

Therefore, an advantage of the above mentioned optical functioning element in accordance with the present invention is that it becomes possible to form a high quality crystal film of GaAs or AlGaAs on the substrate without arranging a special layer such as a super lattice structure or a composition graded layer, since the difference of lattice constant between the substrate and GaAs or AlGaAs is very small.

Accordingly, in the event that the element having a layered structure made from GaAs or AlGaAs is formed on the substrate, generation of defects due to distortion is minimized and the reliability of the element is raised as well as the life of the element is elongated.

Also, another advantage of the present invention is that it becomes possible to emit the optical output from the rear surface of the substrate and receive the optical input from the same rear surface of the substrate without forming a hole in the substrate, since the substrate has a forbidden band width which is equivalent to the energy larger than the optical energy of light emitted from the GaAs or AlGaAs layer as the output thereof or irradiated to the layer as the input thereto.

Accordingly, it becomes possible to realize various kinds of optical functioning elements which are operated by passing light through the substrate thereof. Also, it becomes possible to realize an optical system in which the input beam or output beam is arranged perpendicular to the substrate surface. Further, it becomes possible to realize a high density two-dimensional array device which is bistable and functions as an optical device such as a switch circuit, memory circuit, or a differential gain circuit.

Also, it is still another advantage of the present invention that as the lattice constant difference between the substrate and GaAs or AlGaAs becomes small, the above mentioned advantages of the invention are further enhanced and the problems due to the distortion of the element are more reliably obviated. More particularly, when the difference is less than 4%, the crystalline characteristic of GaAs or AlGaAs deposited on the substrate is further upgraded and the distortion of element due to mismatch of lattice constant is minimized, which heightens the quality of the element and lengthens the service life of the element which comprises the GaAs or AlGaAs layer formed on the substrate.

It is yet another advantage of the present invention that by using a single crystal substrate having the lattice constant difference of less than 0.4%, the above mentioned advantages of the invention are still further enhanced so that it becomes possible to further heighten the quality of crystal of GaAs or AlGaAs deposited on the substrate and further lengthen the service life of the element.

Further objects and advantages of the present invention will be apparent from the following description of the preferred embodiments of the invention as illustrated in the accompanying drawings.

DESCRIPTION OF THE PREFERRED EMBODIMENTS

Embodiments of the present invention are described in detail with reference to the drawings and in comparison to the related art structures which are also explained with reference to the drawings.

The embodiments of the invention are improved from the related art structures.

Figure 1:
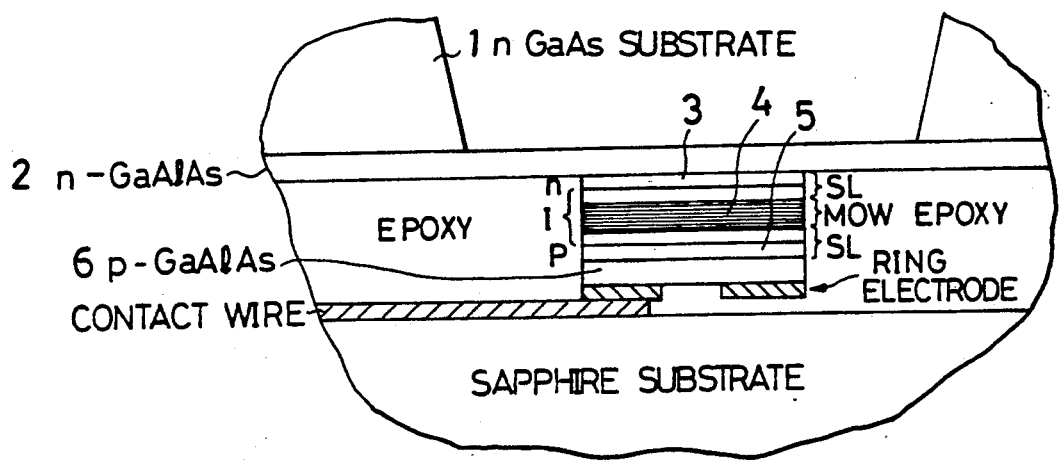
FIG. 1 is an explanatory view of an example of the optical functioning element in accordance with the related art.

FIG. 1 illustrates a first example of the optical functioning element of the type which receives input signal from one surface thereof and outputs the signal from the opposite surface thereof.

The first example of the element illustrated in FIG. 1 comprises an n-type GaAs substrate 1 on which are stacked in this order an n-type AlGaAs layer 2, an n-type superlattice layer 3 comprising alternately stacked n-type GaAs films of several ten Ås thick and n-type AlGaAs films of the same thickness, a multiquantum well (MQW) layer 4 comprising alternately stacked GaAs films of a little less than 100Å thick and AlGaAs films of the same thickness, a p-type superlattice layer 5 comprising alternately stacked p-type GaAs films of several ten Ås thickness and p-type AlGaAs films of the same thickness, and a p-type AlGaAs layer 6. The n-type GaAs substrate 1 is etched to form a hole of about 100Å diameter therein to reach the n-type AlGaAs layer 2 to constitute a mesa structure at the position behind and corresponding to the stacked-layer structure mentioned above. Due to this hole, the light of the above mentioned wavelength penetrates and passes through the stacked-layer structure without being blocked by the substrate 1.

That is, in accordance with the first example of the optical functioning element of FIG. 1 mentioned above, an optical logic function is obtained by vertically passing the light through the element from the front surface to the rear surface or vice versa. For this purpose, the window (hole) is formed through the substrate 1 so as to prevent the light from being absorbed by the substrate 1 of n-type GaAs.

Figure 2:
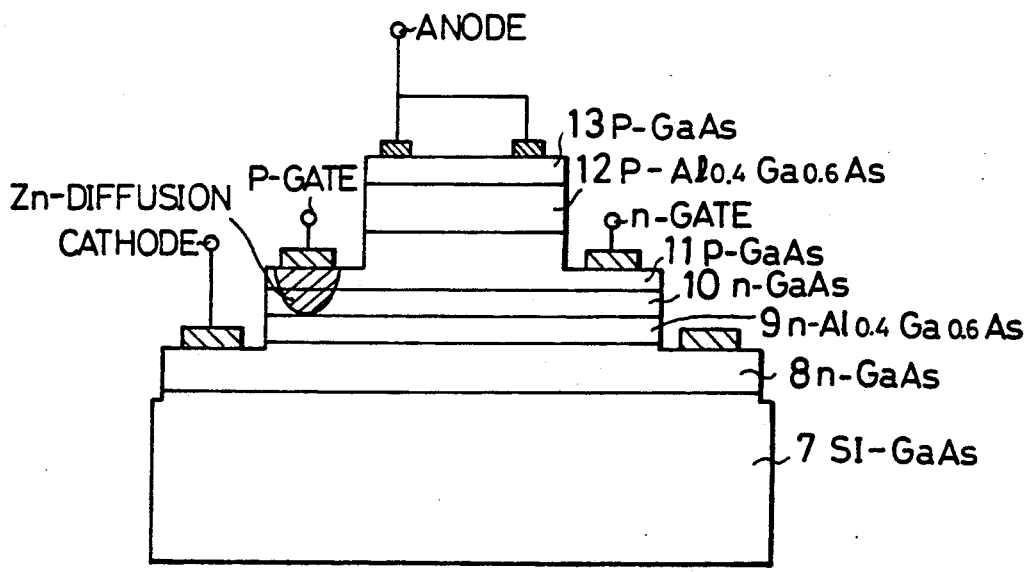
FIG. 2 is an explanatory view of another example of the optical functioning element in accordance with the related art.

Next, FIG. 2 illustrates a second example of the optical functioning element which receives the input optical signal from the front surface thereof and outputs the signal from the same front surface.

The second example of the element of FIG. 2 comprises an SI (Semi-Insulation)-GaAs substrate 7 on which are stacked in this order an n-type GaAs layer 8, an n-type AlGaAs layer 9, an n-type GaAs layer 10, a p-type GaAs layer 11, a p-type AlGaAs layer 12, and a p-type GaAs layer 13. The input light is transmitted to the element from the uppermost layer of the stacked structure and the output light is emitted from the same uppermost layer so as to achieve a memory function or other logic functions.

Figure 3:
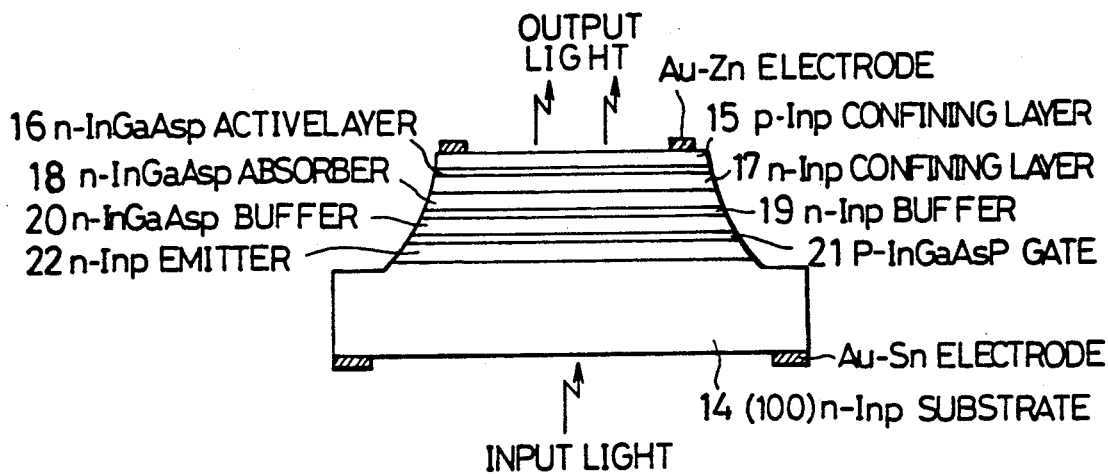
FIG. 3 is an explanatory view of still another example of the optical functioning element in accordance with the related art.

FIG. 3 illustrates a third example of the optical functioning element which receives the input light from the rear surface thereof and emits the output light from the front surface thereof.

The optical functioning element of FIG. 3 comprises an n-type InP substrate 14, a light receiving portion formed on the substrate 14 and a light emitting portion formed on the light receiving portion. The light receiving portion is composed of an n-type InP emitter 22, a p-type InGaAsP gate 21, an n-type InGaAsP buffer 20, an n-type InP buffer 19, and an n-type InGaAsP absorber 18, stacked on the substrate 14 in this order. The light emitting portion is composed of an n-type InP confining layer 17, an n-type InGaAsP active layer 16 and a p-type InP confining layer 15, stacked on the light receiving portion in this order so as to achieve an optical logic function.

In accordance with the above mentioned third structure of FIG. 3, the forbidden band width of the n-type InP is wider than that of the InGaAsP layer which generates or absorbs light and the InGaAsP layer's lattice matches with the InP layer's lattice. Therefore, it becomes possible for the light to access the element from either side of the element having the substrate being attached thereto. However, with regard to the GaAs group or the AlGaAs group, the substrate of GaAs has the narrowest forbidden band width of all the materials in the group. Therefore, it is impossible to realize the structure of the third example of FIG. 3 mentioned above with the use of the GaAs or AlGaAs group materials.

Also, there is proposed a fourth example of the optical functioning element comprising a GaAs substrate and an InGaAs layer formed on the substrate. The InGaAs layer has a lattice constant which is far different from that of the GaAs substrate and a forbidden band width which is narrower than that of the GaAs substrate. Thus, it is impossible to grow the lattice matched layer on the GaAs substrate. By stacking the InGaAs layer on the GaAs substrate, the substrate becomes transparent with respect to the accessing light having a predetermined wavelength.

In the event that the light emitting portion (layer) or light receiving portion (layer) of the element to which the light accesses is made from GaAs or AlGaAs, the substrate on which the layer is stacked is made from GaAs from the standpoint of lattice matching.

In accordance with the first example of the optical functioning element of the related art illustrated in FIG. 1 mentioned above, a part of the GaAs substrate is removed so that the light is not absorbed by the substrate at the portion of the part. The removing process is conducted in such a way that the part of the substrate is etched with the use of an etching solution having different etching rates with respect to GaAs and AlGaAs, for example an ammonium solution, so that the etching process is stopped at the surface of the AlGaAs layer 2 whereby only the GaAs layer 1 is selectively etched and removed.

It is to be noted that the GaAs substrate has to be at least 70 to 100 μm thick to maintain the strength thereof and prevent from being distorted.

Also, the substrate is etched not only in the vertical direction (perpendicular to the substrate surface) but also in the lateral direction thereof with the same etching rate so that a hole is formed in the substrate which hole has a diameter twice as large as the depth thereof. Such a hole hampers the close arrangement of a plurality of elements in a two-dimensional plane to constitute an array device. Therefore, when the array device is to be made, one common hole is formed for a plurality of elements instead of forming a hole for each of respective elements, which reduces the strength of device and makes it difficult to widely arrange a large number of elements since the device becomes curved and distorted. Especially, when the element has a light emitting function, heat is generated from the element, which impairs the functional reliability of the element since the element itself does not effectively radiate heat. Therefore, a plurality of elements have to be directly mounted on a heat radiator plate made from transparent materials, for example, sapphire in the structure of FIG. 1, which involves problems such that electrode patterns have to be precisely formed on the radiator plate, that the periphery of element has to be covered, and that the element has to be accurately positioned with respect to the radiator plate. Therefore, it becomes very difficult to realize a high density two-dimensional array device using the optical functioning elements of the related art mentioned above.

Besides, there are further problems at the time of producing the element such that it becomes necessary to form patterns on both of the upper and lower surfaces of the substrate, and that the n-type AlGaAs layer surface which is exposed by the partial etching of the GaAs substrate mentioned above is roughened by the etching process, which induces the loss of optical power of input and output signals.

The second example of the optical functioning element of FIG. 2 mentioned above has the structure in which the accessing light is received and emitted from the same surface of the element substrate, which obviates the problems of the first example mentioned above.

Figure 4:
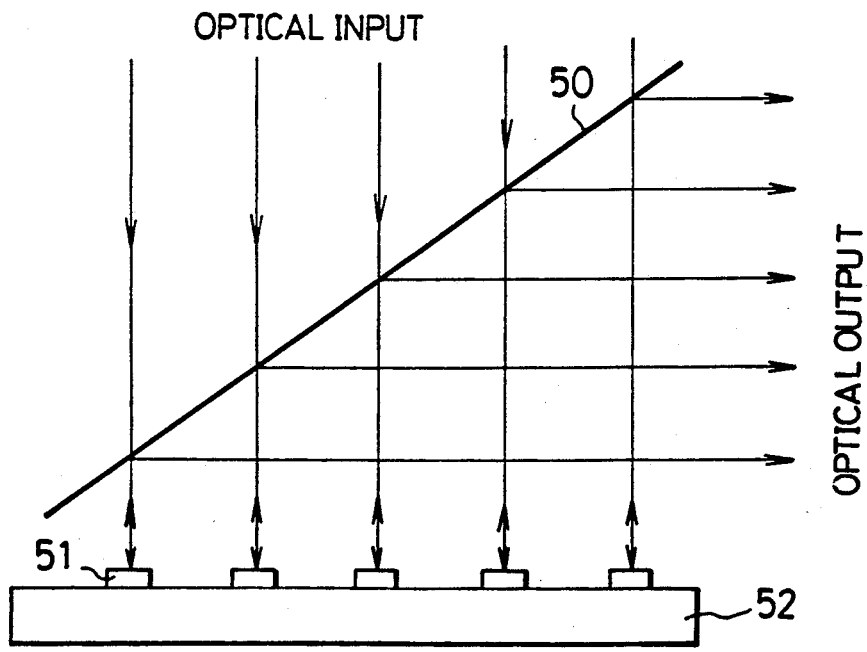
FIG. 4 is an explanatory view for explaining the related art technique.

However, in accordance with the structure of the second example, it becomes necessary to prepare an optical system or device for separating the input and output light beams, as illustrated in FIG. 4 wherein a halfmirror 50, an optical element 51 and a semiconductor substrate 52 are depitched. This is because the optical systems or devices (not shown) for receiving input beams from and for transmitting output beams to are disposed on the same side of the element. This hampers the realization of a small and compact optical system using the elements to constitute a two-dimensional device. Besides, another problem arises in that it becomes necessary to accurately align the element with the other optical systems.

Next, with regard to the third example of the optical functioning element of the related art of FIG. 3 mentioned above, the structure of this example can not be applied to the structure in which the GaAs or AlGaAs group materials are used. This is because light ca not penetrate through the substrate since the forbidden band width of the substrate made from GaAs is the narrowest.

Also, in accordance with the fourth example of the optical functioning element of the related art mentioned above, the light emitting layer is made from InGaAs which has a narrower forbidden band width than GaAs. Therefore, the InGaAs layer has to be stacked on the GaAs substrate. However, the lattice structure of the InGaAs layer does not match with that of the GaAs substrate, which causes to distort the element. Therefore, it becomes difficult to heighten the quality of the stacked-layer structure of the element and easy to generate the dislocation defects. Also, due to the heat generated from the element, the line defects of the structure are generated and transferred within the structure, which degrades the quality of the element and impairs the stable function of the element.

The embodiments of the present invention described below obviate the above mentioned problems of the related art.

Figure 5:
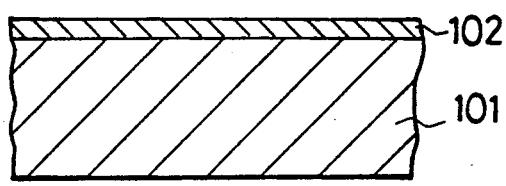
FIG. 5 is a sectional view of the substrate of an embodiment of the optical functioning element in accordance with the present invention.

FIG. 5 illustrates a substrate structure in accordance with a first embodiment of the present invention.

The substrate 101 for constituting the optical functioning element is made from single crystal substance ZnSe. On the substrate 101, a GaAs layer 102 is deposited by an epitaxial growth process.

It is to be noted that the GaAs layer may be replaced by an $Al_x Ga_{1-x} As$ layer, wherein the suffix number x of Al may be any value between 0 and 1. Also, as the epitaxial growth process, the MBE method or the MOCVD method is adopted. In the epitaxial process, by irradiating the structure with an optical beam, it becomes possible to effectively reduce the growing crystal temperature.

The substrate 101 may be any desired thickness. However, the substrate 101 has to be at least 60 μm thick for the sake of maintaining the strength thereof.

It is to be noted that the substrate 101 may be made from $ZnS_y Se_{1-y}$ instead of ZnSe. In that event, by setting the suffix number y of S as $0 < y < 1$, it becomes possible to further reduce the lattice constant difference between the substrate and GaAs or $Al_x Ga_{1-x} As$. Further, by setting the suffix number y as $0.05 < y < 0.10$, it becomes possible to still further reduce the lattice constant difference so that the lattice of the substrate further well matches with the lattice of epitaxial crystal formed on the substrate, which heightens the quality of the epitaxial crystal of GaAs or $Al_x Ga_{1-x} As$ formed on the substrate.

The following table-1 represents the results of epitaxial growth of GaAs on the substrate, changing the substance of the substrate.

TABLE 1

| Single-crystal of Substrate | Lattice Const. Dif. from GaAs | Crystal of GaAs on Substrate |
| --- | --- | --- |
| ZnSe | 0.28% | single-crystal |
| ZnSe | 4.3% | poly-crystal |
| $ZnS_{0.06}Se_{0.94}$ | nearly 0% | single-crystal |
| $CaF_2$ | 3.5% | single-crystal with grain boundary |
| $SrF_2$ | 2.6% | single-crystal with grain boundary |
| $Ca_{0.49}Sr_{0.51}F_2$ | 0.3% | single-crystal |
| $Ca_{0.52}Sr_{0.48}F_2$ | 0.5% | single-crystal with grain |

TABLE 1-continued

| Single-crystal of Substrate | Lattice Const. Dif. from GaAs | Crystal of GaAs on Substrate |
| --- | --- | --- |
| | | boundary |

Note: Single-crystal in the table represents single-crystal with no grain boundary.

As can be seen from the table-1, when the lattice constant difference from GaAs is less than 4%, the crystal formed on the substrate has a structure of single-crystal grain although grain boundary appears therein. Further, when the lattice constant difference becomes less than 0.4%, the poly-crystal structure without grain boundary is obtained. On the other hand, when the lattice constant difference is more than 4%, the layer of multi-crystal structure is formed on the substrate and the single-crystal grain is not obtained.

Figure 6:
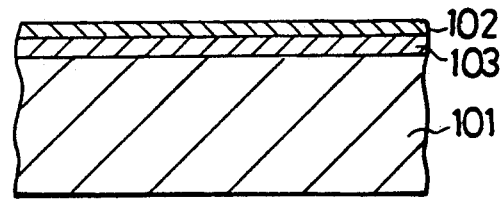
FIG. 6 is a sectional view of the substrate of another embodiment of the optical functioning element in accordance with the present invention.

FIG. 6 illustrates the substrate of a second embodiment of the optical functioning element in accordance with the present invention.

The second embodiment of FIG. 6 comprises a super lattice layer 103 interposed between the ZnSe substrate 101 and the layer 102 made from GaAs or $Al_xGa_{1-x}As$ (referred to simply AlGaAs below). The super lattice layer 103 comprises alternately stacked layers of 10 to 100Å thick made from $ZnS_ySe_{1-y}$ and layers of the same thick made from ZnSe. It may be possible to set the suffix numerel y to be the same as in the case of the first embodiment mentioned above.

By adopting the structure of FIG. 6, it becomes possible to further reduce the difference of lattice constant between the layer 102 of GaAS or AlGaAs and the layer 103 on the substrate 101.

It is to be noted that either conductive type (p-type or n-type) can be used for the substrate of ZnSe or $ZnS_ySe_{1-y}$.

Also, in the first and second embodiments mentioned above, the layer 102 may be constituted from a double-layer super lattice structure made of a combination of a GaAs layer and an AlGaAs or AlAs layer, or a combination of AlGaAs layers of different composition ratio, or a combination of an AlGaAs layer and an AlAs layer, each layer being less than 100Å thick. By such an arrangement, it becomes possible to attenuate the diffusion of impurities and transfer of defects from the ZnSe substrate to the active portion of the element formed on the substrate. The reason of that is that the small stress caused by lattice constant difference between super lattice layers fixes impurities and defects in super lattice.

Figure 7:
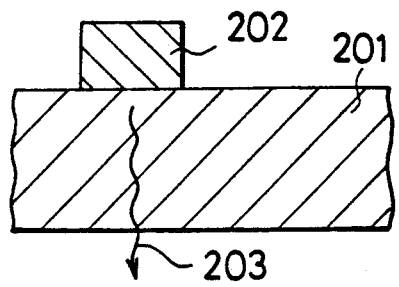
FIG. 7 is a sectional view of still another embodiment of the optical functioning element in accordance with the present invention.

FIG. 7 illustrates a third embodiment of the optical functioning element in accordance with the present invention.

The embodiment of FIG. 7 comprises a substrate 201 having the structure of FIG. 5 or 6 and a light emitting element 202 made from GaAs of AlGaAs stacked on the substrate and having at least one junction therein so that current passes through the junction whereby light is generated therefrom which light is emitted from the rear side of the substrate 201 as the optical output 203. The junction may be of the type of p-n junction, double-hetero junction, or single-hetero junction. Also, the junction may be so constructed that an insulation layer of i-type film is interposed between the p-type layer and the n-type layer.

Figure 8:
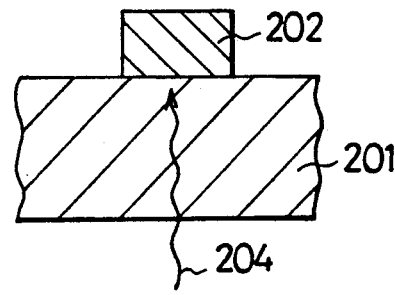
FIGS. 8 to 19 are sectional views of different embodiments of the optical functioning element in accordance with the present invention.

FIG. 8 illustrates a fourth embodiment of the optical functioning element in accordance with the present invention.

The embodiment of FIG. 8 comprises a substrate 201 having the structure of FIG. 5 or 6 and a light receiving element 202 made from GaAs or AlGaAs stacked on the substrate and having at least one junction therein so that current passes through the junction whereby the element becomes sensitive to the input light 204 received from the rear side of the substrate 201. Schottky junction or MIS junction can be used in addition to the junctions exemplified in the third embodiment.

Figure 9:
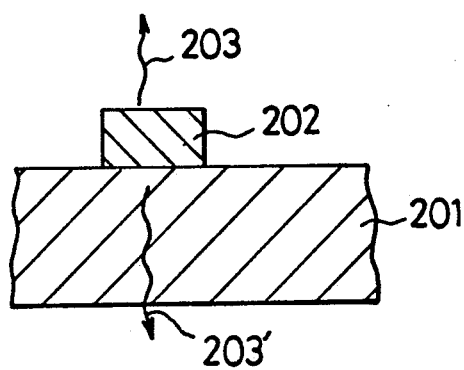

FIG. 9 illustrates a fifth embodiment of the optical functioning element in accordance with the present invention.

The embodiment of FIG. 9 comprises a substrate 201 having the structure of FIG. 5 or 6 and a light emitting element 202 made from GaAs or AlGaAs stacked on the substrate and having at least one junction therein so that current passes through the junction whereby light is generated therefrom and the light is emitted from the rear side of the substrate 201 as an optical output 203' and also from the front side of the element as an opttical output 203. The junction of the element is the same as the third embodiment.

Figure 10:
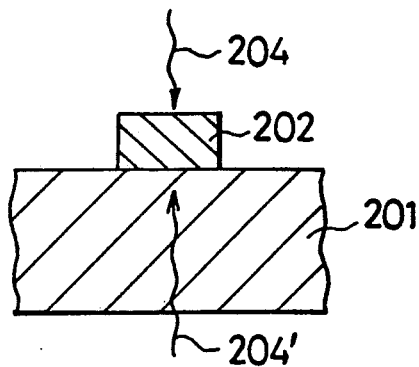

FIG. 10 illustrates a sixth embodiment of the optical functioning element in accordance with the present invention.

The embodiment of FIG. 10 comprises a substrate 201 having the structure of FIG. 5 or 6 and a light receiving element 202 made from GaAs or AlGaAs stacked on the substrate and having at least one junction therein so that current passes through the junction whereby the element becomes sensitive to the input light 204 received from the front side of the substrate 201 and also to the input light 204' received from the rear side of the substrate 201. The junction structure of the element may be the same as the fourth embodiment.

Figure 11:
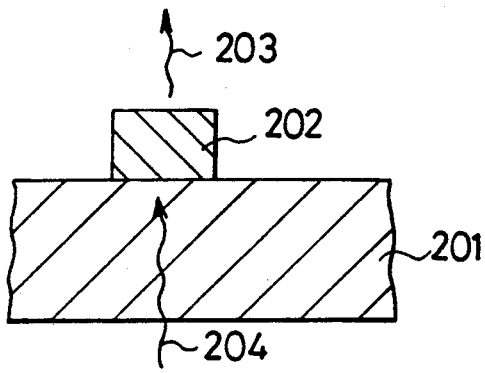

FIG. 11 illustrates a seventh embodiment of the optical functioning element in accordance with the present invention.

The embodiment of FIG. 11 comprises a substrate 201 having the structure of FIG. 5 or 6 and an optical element 202 made from GaAs or AlGaAs stacked on the substrate and having at least one junction therein so that current passes through the junction whereby light is generated around the junction and/or the element becomes sensitive to the input light so that the optical input 204 received from the rear side of the substrate 201 is detected by the element and that the generated light is emitted from the front side of the substrate 201 as an optical output 203. Two or more junctions may be arranged in the element so that the light emitting function and the light receiving function are performed in the different junctions respectively. The junction structure of the element may be the same as the third or fourth embodiment.

The optical element 202 of FIG. 11 may be constructed as a resonator having reflection structures in the upper and lower surface sides thereof. Due to such an arrangement, it becomes possible that the input light 204 transmitted from the rear (lower) side of the substrate 201 undergoes operations of modulation, filtering and other nonlinear functions while passing through the element 202 and after that the light is emitted from the front (upper) side of the substrate as the optical output 203. It is to be noted that in such an arrangement of the resonator, it becomes unnecessary to arrange the junction within the element. Also, in accordance with the resonator structure, it becomes possible to output as laser beam from the element.

Figure 12:
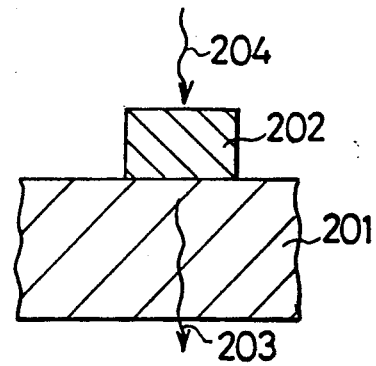

FIG. 12 illustrates an eighth embodiment of the optical functioning element in accordance with the present invention.

The embodiment of FIG. 12 differs from the seventh embodiment of FIG. 11 in that the direction of the input and output light are reversed. Other structure and function thereof are substantially the same as those of the embodiment of FIG. 11.

Figure 13:
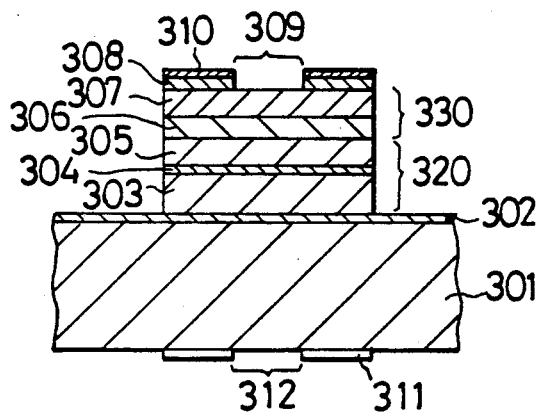

FIG. 13 illustrates a ninth embodiment of the optical functioning element in accordance with the present invention.

The embodiment of FIG. 13 comprises an n-type ZnSe substrate 301, an n-type GaAs or AlGaAs buffer layer 302 formed on the substrate 301, an n-type AlGaAs layer 303, a p-type GaAs layer 304, an n-type AlGaAs layer 305, an n-type GaAs or AlGaAs layer 306, a p-type GaAs or AlGaAs layer 307, and a p+-type GaAs layer 308 stacked in this order, wherein a window 309 is formed in the p+-type GaAs layer 308 so that the layer 307 is exposed from the window 309. Also, on the p+-type GaAs layer 308, a p-side electrode 310 is formed. The electrode 310 may be made from Au-Zn/Au, for instance.

As illustrated in FIG. 13, the element is formed by removing the stacked layers by, for example, etching the layers until reaching the layer 302, the remaining portion of the element. However, when another element is to be formed in the vicinity thereof, only a groove of appropriate depth for isolating the element may be formed instead of etching away the entire area around the element. Also, the layer 302 may be etched around the element.

On the rear surface of the substrate 301, an n-side electrodes 311 is formed at the position corresponding to the upper electrode 310 and a window 312 is formed in the electrode 311 so that the optical input can be transmitted into the element and/or the optical output can be emitted from the element. The electrode 311 is made from, for example, In or In-Ga alloy.

In accordance with the structure of FIG. 13, by applying positive electric field to the electrode 310 and negative electric field to the electrode 311, it becomes possible to function the layers 303, 304 and 305 as the emitter, base and collector, respectively, of an HPT (Heterojunction Photo Transistor). Also, it becomes possible to utilize the portion 330 composed of the layers 306 and 307 as an LED having a single-hetero junction.

Therefore, when light is input to the element from the substrate 301 side through the window 312, the light is absorbed by the HPT 320 so that a photo current is generated whereby the HPT 320 is turned on. When the HPT is turned on, the current flows to the LED 330 and energize it to emit an optical output from the upper side of the element through the window 309. At the same time, a part of the output light is absorbed by the HPT 320, which results in the optical feed back. According to the amount of the optical feed back, it becomes possible to function the element as an optical nonlinear functional device.

It is to be noted that the GaAs layers and the AlGaAs layers may be formed by an MOCVD method or an MBE method.

Figure 14:
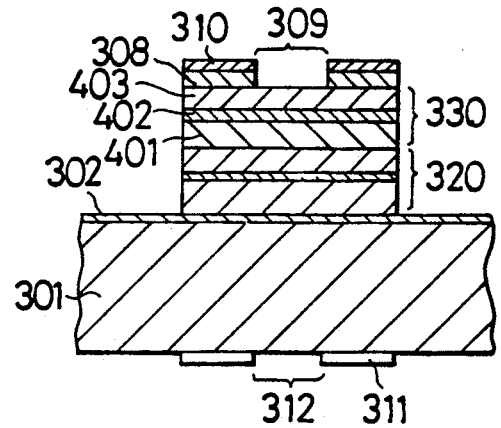

FIG. 14 illustrates a tenth embodiment of the optical functioning element in accordance with the present invention.

The embodiment of FIG. 14 differs from the ninth embodiment of FIG. 13 in that the LED 330 is constituted from a double-hetero junction structure. The structure of the HPT 320 is substantially the same as the embodiment of FIG. 13.

The LED 330 comprises an n-type AlGaAs layer 401 formed on the HPT 320, a GaAs or AlGaAs layer 402, a p-type AlGaAs layer 403, a p+-type GaAs layer 308 formed in this order by the epitaxial growth process. The layer 402 functions as the active layer. The layers 401 and 403 function as the clad layer. A window 309 for passing light is formed in the layer 308. Also, a p-side electrode 310 is formed on the layer 308. An n-side electrode 311 is formed on the rear side surface of the substrate 301. A window 312 for passing through light is formed in the electrode 311.

In accordance with the optical functioning element of FIG. 14, by applying a positive electric field to the electrode 310 and a negative electric field to the electrode 311, it becomes possible to realize an optical element which is sensitive to the input light introduced through the window 312 and emits the output light through the window 309, as in the case of the embodiment of FIG. 13.

The arrangement of the LED 330 and the HPT 320 may by reversed, that is the LED 330 is formed on the substrate and the HPT 320 is formed on the LED so that the optical input is introduced from the upper side of the element and the output is emitted from the lower side of the element.

Figure 15:
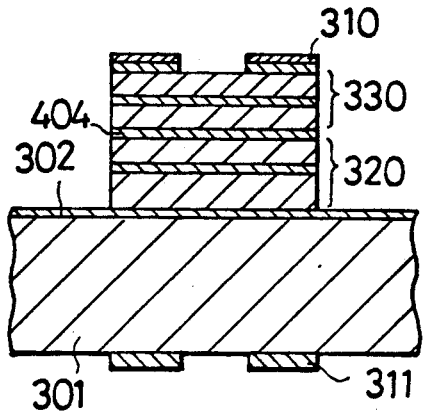

FIG. 15 illustrates an eleventh embodiment of the optical functioning element in accordance with the present invention.

In the embodiment of FIG. 15, an optical absorption layer 404 is interposed between the LED 330 and the HPT 320. The layer 404 is made from GaAs or AlGaAs, or an alternately stacked structure of GaAs and AlGaAs. By arranging the layer 404 as being opaque with respect to a wavelength or a wavelength band of the light generated in the element, it becomes possible to change the amount of the optical feed back from the LED 330 to the HPT 320 so as to control the optical nonlinear function.

Figure 16:
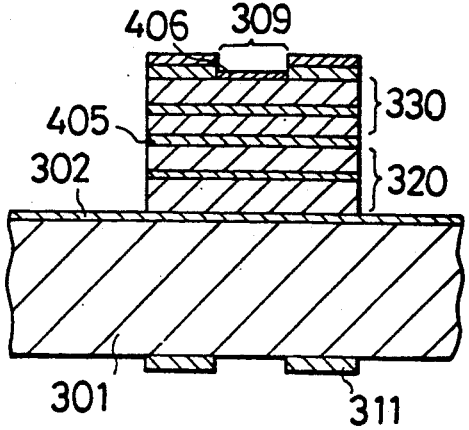

FIG. 16 illustrates a twelfth embodiment of the optical functioning element in accordance with the present invention.

In the embodiment of FIG. 16, optical reflection films 405 and 406 are disposed on the upper and lower surface of the LED 330, respectively, so as to constitute a resonator. More particularly, the film 405 is composed of a double-layer structure made from GaAs and AlGaAs, or two kinds of AlGaAs having different composition ratio, or alternately stacked layers of GaAs and AlGaAs. The thickness of each layer is about a quarter of the wavelength of the generated light within the medium so as to constitute a Bragg reflection layer, the reflection layer 405 reflects the light which is generated from the LED 330 and emitted downward.

The reflection film 406 is disposed in the window 309. The film 406 is composed of alternately stacked two kinds of dielectric layer or metallic layer, such as $SiO_2$, SiN, or $TiO_2$, MgO, ZnO, ZnS, or Si, Au, etc. The thickness of each layer is about a quarter of the wavelength of the generated light within the medium. The film 406 reflects the light generated from the LED 330 and emitted upward.

Each of the reflection films 405 and 406 may be constituted from a single layer of Au or Au-Sn to form a resonator structure.

In accordance with the resonator structure comprising the reflection films 405 and 406 sandwiching the LED 330, it becomes possible to use the LED 330 as a surface light emitting type semiconductor laser which emits an optical beam in the direction perpendicular to the substrate 301. Also, by combining the LED 330 with the HPT 320, it becomes possible to realize an optical element which performs an optical nonlinear function.

Figure 17:
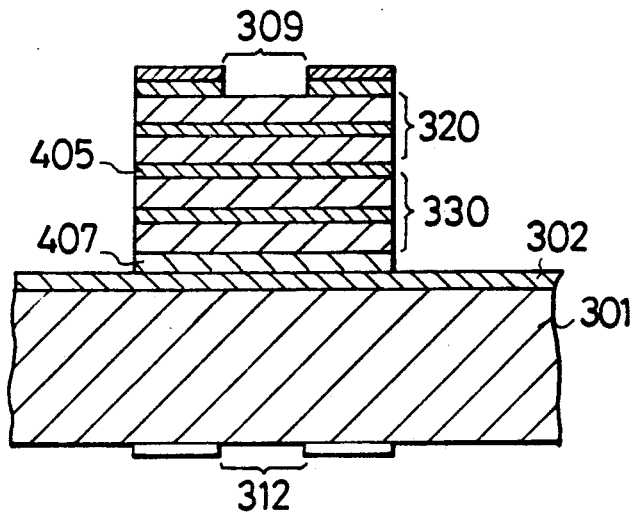

FIG. 17 illustrates a thirteenth embodiment of the optical functioning element in accordance with the present invention.

In the embodiment of FIG. 17, the LED 330 is formed on the buffer layer 302 and the HPT 320 is formed on the LED 330. The Bragg reflection layer 405 is disposed between the LED 330 and the HPT 320 as in the case of the embodiment of FIG. 16. Also, a Bragg reflection layer 407 having the same structure as the layer 405 is disposed between the LED 330 and the layer 302. The layers 405 and 407 constitute a resonator structure with respect to the light generated from the LED 330. Thus, the LED 330 can be used as a surface light emitting type semiconductor laser which emits an optical beam in the direction perpendicular to the surface of the substrate 301.

In accordance with the structure of FIG. 17, the input light is introduced to the HPT 320 through the window 309 and the output light is emitted from the element through the window 312 after penetrating through the substrate 301. It is possible to perform the nonlinear function by the structure of FIG. 17 as in the case of FIG. 16.

It is to be noted that the structure of the layer 302 may be formed as the Bragg reflection layer structure whereby the above mentioned lower reflection layer 407 specially arranged as the Bragg reflection layer can be deleted.

It is also to be noted that in each of the embodiments of FIGS. 13 to 17, the LED (or LD) and the HPT may be individually formed on the substrate, respectively. Also, instead of the HPT, a PIN diode made from GaAs and AlGaAs, an MIS diode, a Schottky diode or other diode structure may be formed as the light receiving element.

Also, other types of LED or LD may be adopted as the light emitting element other than the exemplified structures in the above mentioned embodiments. For example, a multiquantum well structure or a singlequantum well structure may be formed in the light emitting portion. Also, whole of the clad layer may be formed as the Bragg reflection layer structure.

Figure 18:
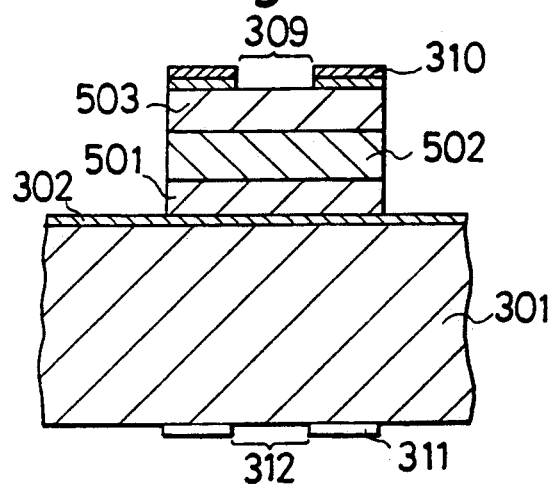

FIG. 18 illustrates a fourteenth embodiment of the optical functioning element in accordance with the present invention.

In the embodiment of FIG. 18, a resonator is constructed in the element. On the buffer layer 302, an n-type Bragg reflection layer 501 is formed. The layer 501 is composed of a multilayered structure made from alternately stacked two kinds of films selected from GaAs, AlGaAs and AlAs. Note that AlGaAs includes a plurality kinds of the substance having a different composition ratio.

A quantum well portion 502 is formed on the layer 501. The portion 502 is formed either as a multiquantum well structure or a singlequantum well structure. The multiquantum well structure comprises alternately stacked i-type GaAs layers and AlGaAs layers or alternately stacked two kinds of layers selected from GaAs, AlGaAs and AlAs (AlGaAs includes a plurality kinds of the substance having a different composition ratio.). The thickness of each layer is less than about 100Å.

The singlequantum well structure comprises a GaAs layer of about less than 100Å thick or an AlGaAs layer of about the same thick.

A p-type Bragg reflection layer 503 having the same structure as the layer 501 is formed on the portion 502 so as to constitute a resonator in conjunction with the lower layer 501.

An electrode 310 is disposed on the upper surface of the element and a counter electrode 311 is disposed on the rear surface of the substrate 301. By applying current between the electrodes 310 and 311, a semiconductor laser beam can be generated in the portion 502 and the laser is emitted from the windows 309 and 312.

Also, by applying an inverse bias voltage between the electrodes 310 and 311, it becomes possible perform a nonlinear function to the input light introduced through the window 309 or 312 and emit the output light from the opposite window. Also, it is possible to perform a nonlinear function in response to the optical intensity of the input light without applying current or voltage.

It is to be noted that the embodiment of FIG. 18 can be used in conjunction with the other embodiments of the invention.

Figure 19:
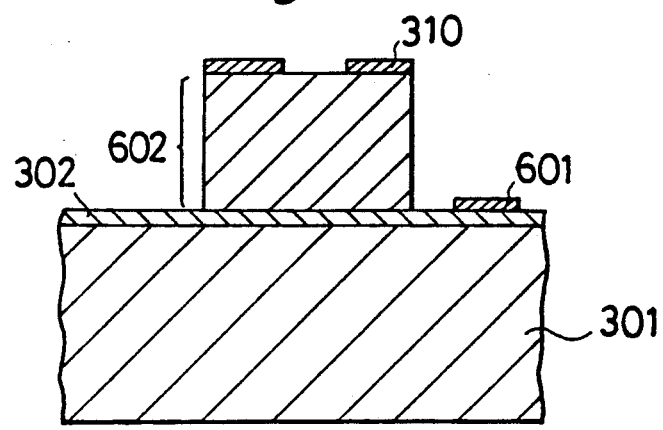

FIG. 19 illustrates a fifteenth embodiment of the optical functioning element in accordance with the present invention.

In the embodiment of FIG. 19, instead of forming the electrode on the rear surface of the substrate 301 as in the case of the embodiments mentioned before, the element structure is arranged in such that the resistance of the buffer layer 302 is lowered and that an electrode 601 is formed on the layer 302. By running current or applying voltage between the electrodes 310 and 601, the functional element 602 is energized to function.

In accordance with the embodiment of FIG. 19, whatever the conductive type of the substrate 301 is, that is, irrespective that the substrate 301 is made from an n-type substance, or a p-type substance or an insulator material, the layer structure of the functional element 602 can be determined.

When the layer 302 is of p-type, the electrode 601 may be made from Au-Zn/Au, for example. On the other hand, when the layer 302 is of n-type, the electrode 601 may be made from Au-Ga-Ni/Au, for example.

It is to be noted that the structure of FIG. 19 can be applied to any of the above mentioned embodiments of the present invention.

In accordance with the embodiments of FIGS. 13 to 19, it becomes possible to realize a one-dimensional or two-dimensional array device comprising a plurality of the elements of the embodiment formed on the same substrate.

It is also to be noted that the material of the substrate of the present invention is not limited to ZnSe, single-crystal of ZnSSe, strontium fluoride, calcium fluoride, or mixed crystal of those substances, as exemplified in the description of the embodiments.

Many widely different embodiments of the present invention may be constructed without departing from the spirit and scope of the present invention. It should be understood that the present invention is not limited to the specific embodiments described in the specification, except as defined in the appended claims.

What is claimed is:

1. An optical functioning element having at least one of a light emitting function, a light receiving function and a light modulating function, said optical functioning element comprising:
   an optical element for carrying out said at least one function, having a layer-stacked structure of crystalline substance layers, each of which is selected from a group consisting of GaAs, AlGaAs and AlAs, said layer-stacked structure including at least one junction formed by different conductive type layers;
   a substrate of a single crystal substance for mounting said optical element on an upper face thereof, said substrate being transparent with respect to a wavelength of light emitted from said optical element or to which said optical element is photosensitive to allow said optical element to emit or receive said wavelength of light through said substrate; and
   an epitaxial growth layer of $Al_xGa_{1-x}As, 0 \leq x \leq 1$, having a first lattice constant and formed between said optical element and said substrate, wherein the single crystal substance of said substrate has a second lattice constant such that the difference between said first lattice constant and said second lattice constant is small enough such that a lattice structure of said substrate matches with a lattice structure of said epitaxial growth layer.

2. An optical functioning element according to claim 1, wherein said difference between said first lattice constant and said second lattice constant is less than 4%.

3. An optical functioning element according to claim 2, wherein said single crystal substance of said substrate is selected from a group consisting of $CaF_2$ and $SrF_2$.

4. An optical functioning element according to claim 2, wherein said difference between said first lattice constant and said second lattice constant is less than 0.4%.

5. An optical functioning element according to claim 4, wherein said single crystal substance of said substrate is selected from a group consisting of ZnSe and $ZnS_ySe_{1-y}$, $0<y<0.13$.

6. An optical functioning element according to claim 5, wherein said single crystal substance of said substrate is $ZnS_ySe_{1-y}$, $0.05<y<0.10$.

7. An optical functioning element according to claim 4, wherein said single crystal substance of said substrate is ZnSe, and a layer of $ZnS_ySe_{1-y}$, $0<y<0.13$, is inserted between said substrate and said epitaxial growth layer.

8. An optical functioning element according to claim 4, wherein said single crystal substance of said substrate is ZnSe, and a super lattice layer composed of a ZnSSe layer and a ZnSe layer, is inserted between said substrate and said epitaxial growth layer.

9. An optical functioning element according to claim 1, wherein said epitaxial growth layer is a super lattice layer composed of two layers wherein said two layers consist of GaAs and AlGaAs, GaAs and AlAs, two different AlGaAs layers, or AlGaAs and AlAs.

10. An optical functioning element according to claim 1, wherein said substrate has a forbidden band width corresponding to an energy value larger than an energy corresponding to a peak wavelength of an optical output from said optical element.

11. An optical functioning element according to claim 1, wherein said substrate has a forbidden band width corresponding to an energy value larger than an optical energy of light to which said optical element is sensitive.

12. An optical functioning element according to claim 1, wherein a plurality of said optical elements are formed on said substrate to constitute a monolithic array device.

13. An optical functioning element according to claim 1, wherein said junction emits light by passing current therethrough.

14. An optical functioning element according to claim 1, wherein said junction receives light to thereby generate photo-current.

15. An optical functioning element according to claim 13 or 14, wherein said substrate has an electrode on a lower face thereof and said optical element has another electrode thereon.

16. An optical functioning element according to claim 13 or 14, wherein said substrate has an electrode on said upper face thereof and said optical element has another electrode thereon.

* * * * *